United States Patent [19]

Mehrgardt

[11] Patent Number: 4,634,989
[45] Date of Patent: Jan. 6, 1987

[54] DIGITAL FM DETECTOR FOR A DIGITAL SIGNAL

[75] Inventor: Soenke Mehrgardt, March-Neuershausen, Fed. Rep. of Germany

[73] Assignee: Deutsche ITT Industries GmbH, Freiburg, Fed. Rep. of Germany

[21] Appl. No.: 731,130

[22] Filed: May 6, 1985

[30] Foreign Application Priority Data

May 15, 1984 [EP] European Pat. Off. ......... 84105478.6

[51] Int. Cl.$^4$ .............................................. H03D 3/00
[52] U.S. Cl. ..................................... 329/112; 329/126; 329/137; 329/145
[58] Field of Search ............... 329/110, 112, 126, 137, 329/145; 375/94; 455/205, 214

[56] References Cited

U.S. PATENT DOCUMENTS

4,416,016 11/1983 Iapicco ........................... 329/145 X
4,549,143 10/1985 Bouland et al. ................. 329/145 X

FOREIGN PATENT DOCUMENTS

0035166 9/1981 European Pat. Off.
0080014 6/1983 European Pat. Off.
2833335 3/1980 Fed. Rep. of Germany

OTHER PUBLICATIONS

Patent Abstracts of Japan, Band 6, No. 132, Jul. 17, 1982.
Electronics Letters, Band 15, No. 16, Aug. 2, 1979, "Digital Frequency Discriminator", pp. 489-490.

Primary Examiner—Eugene R. LaRoche
Assistant Examiner—Robert J. Pascal
Attorney, Agent, or Firm—Donald J. Lenkszus

[57] ABSTRACT

A digital signal derived from an analog signal by means of an analog-to-digital converter clocked by a clock signal is fed to a first delay element and a 90° phase shifter at the same time. The delayed digital signal is applied through a second delay element to one input of a first multiplier and directly to the other input of this multiplier. In similar fashion, the signal at the output of the 90° phase shifter is applied directly to one input of a second multiplier and through a third delay element to the other input of this multiplier. The output signals of the multipliers are combined in an adder to provide the demodulated digital signal. In accordance with the invention, multiple multiplications and a signal mixture to form the Hilbert-transformed signal, which are necessary in the known prior art, can be avoided.

20 Claims, 4 Drawing Figures

5

DIGITAL FM DETECTOR FOR A DIGITAL SIGNAL

The present invention relates to a digital FM detector containing a digital 90° phase shifter, i.e., Hilbert transformer or quadrature-signal generator, for the digital signal to be demodulated, which is derived from an analog signal by means of an analog-to-digital converter clocked by a clock signal, delay elements producing a delay equal to the period of the clock signal, an adder, and multipliers.

A digital FM detector of this kind is disclosed in German Offenlegungsschrift DE No. 2,833,335 A1, which corresponds to the published British Patent Application GB No. 2,027,297 A. According to this arrangement, detection is accomplished by evaluating the difference between two successive instantaneous phase values formed with a sampling signal. It is important to note that the demodulated signal, called "frequency word" in the prior art documents, is at least a three-bit signal. The two successive instantaneous phase values of the signal to be demodulated are formed by means of a Hilbert transformer, and the further processing is done with stages forming the absolute values of the signals, a threshold logic, a polarity reverser, several exclusive-OR gates, and several parity-check circuits.

The object of the invention is to provide a digital FM detector which works on other digital circuit principles and is simpler in that logic elements as are present in the known arrangement in the form of exclusive-OR gates are not necessary. Furthermore, the need for the multiple multiplications required in the prior art arrangement for frequency words of more than three bits is to be eliminated (for a six-bit frequency word, for example, which should be the lower limit for the resolution required for the analog-to-digital conversion, the prior art arrangement requires seven multiplications, and for an eight-bit frequency word, it requires 31 multiplications).

In attaining the above object, the invention resorts to the arrangement disclosed in German Offenlegungsschrift (OS) DE No. 3,138,464 A1, which in form appears to be close to the invention. However, the arrangement of the German OS differs considerably from that of the invention. In the German OS the digital signal has to be mixed, on the one hand, with a sequence of positive and negative unit pulses and, on the other hand, with a similar pulse sequence separated in phase from the first-mentioned sequence by 90°. From this mixture the Hilbert-transformed signals are derived. These signals have to be low-pass-filtered and the delayed Hilbert-transformed signal has to be multiplied by the undelayed Hilbert-transformed signal.

SUMMARY OF THE INVENTION

A digital signal derived from an analog signal by means of an analog-to-digital converter clocked by a clock signal is fed to a first delay element and a 90° phase shifter at the same time. The delayed digital signal is applied through a second delay element to one input of a first multiplier and directly to the other input of this multiplier. In similar fashion, the signal at the output of the 90° phase shifter is applied directly to one input of a second multiplier and through a third delay element to the other input of this multiplier. The output signals of the multipliers are combined in an adder to provide the demodulated digital signal. In accordance with the invention, multiple multiplications and a signal mixture to form the Hilbert-transformed signal, which are necessary in the known prior art, can be avoided.

BRIEF DESCRIPTION OF THE DRAWING

The invention will be better understood from a reading of the following detailed description in conjunction with the drawing in which.

DETAILED DESCRIPTION

Figure 1:
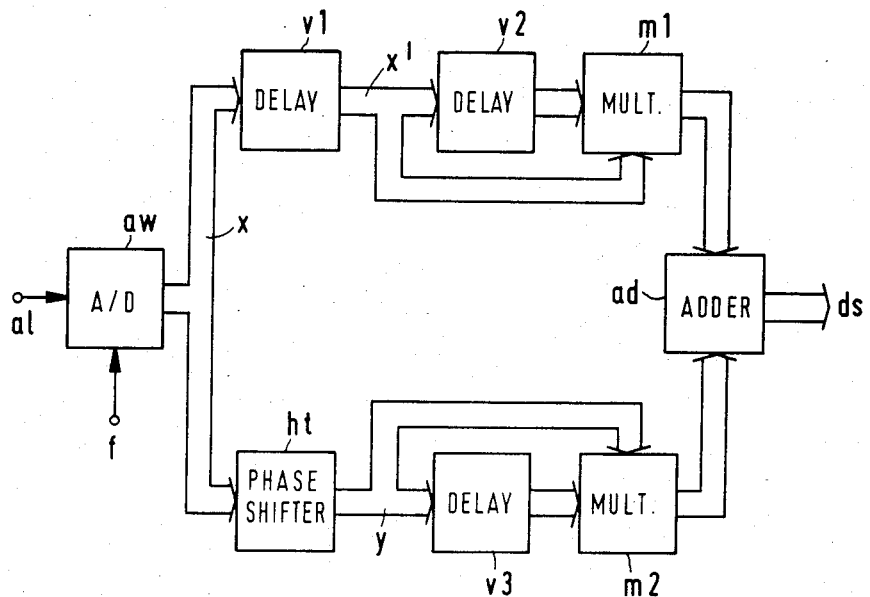
FIG. 1 is a block diagram of a general embodiment of the invention.

The first subcircuit in the signal path of the general embodiment shown in the block diagram of FIG. 1 is the analog-to-digital converter aw, whose analog input is presented with the analog frequency-modulated signal a1 and whose clock input is presented with the clock signal f. The output signal of the analog-to-digital converter aw is the digital signal x, which will generally be present as a parallel digital signal, i.e., a multibit digital word.

The digital signal x is fed to the digital 90° phase shifter ht and the first delay element v1, which gives a delay equal to that of the 90° phase shifter ht. The latter is also referred to as "Hilbert transformer" or "quadrature-signal generator". In the above-mentioned arrangement disclosed in Offenlegungsschrift DE No. 3,138,464 A1, Hilbert-transformed signals are derived from the above-mentioned mixture of the digital signal with the two pulse sequences separated in phase by a 90°. The difference from the present invention is that, according to the present invention, the digital signal x is processed as a suitably delayed digital signal x' without being influenced by a mixing process, and that the Hilbert-transformed signal y need not be produced by mixing.

The delayed signal x' is fed through the second delay element v2 to one input of the first multiplier m1. Correspondingly, the Hilbert-transformed signal y is fed through the third delay element v3 to the first input of the second multiplier m2. The delays t provided by the two delay element v2, v3 are equal to one another and to the period of the clock signal f.

The delayed digital signal x' is applied to the second input of the first multipler m1, and the Hilbert-transformed signal y to the second input of the second multiplier m2. Thus, unlike in the arrangement disclosed in DE No. 3,183,464 A1, the signals are not fed to the two multipliers crosswise. The output signals of the two multipliers m1, m2 are combined in the adder ad, whose output provides the demodulated signal ds.

Figure 2:
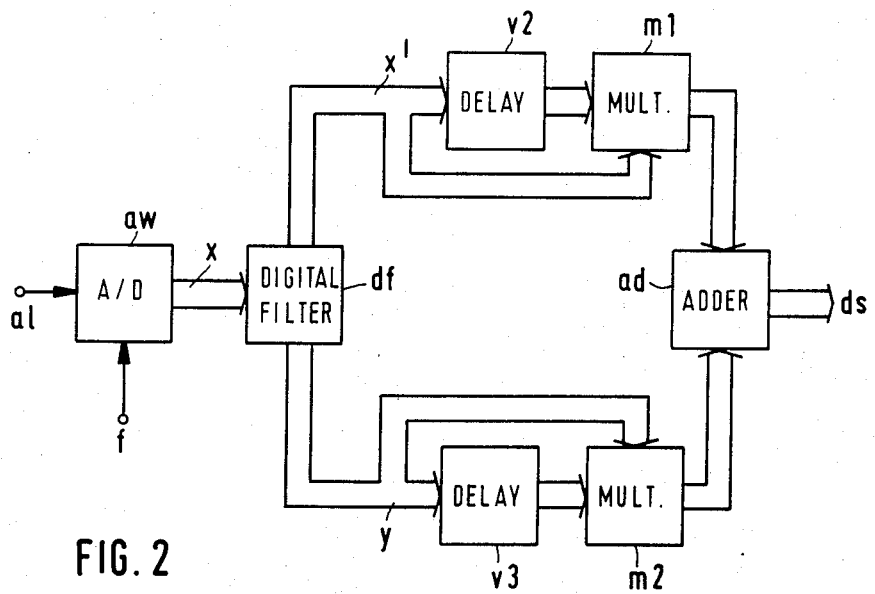
FIG. 2 is a block diagram of a preferred embodiment of the invention.

In the preferred embodiment of FIG. 2, the 90° phase shifter ht and the first delay element v1 have been combined in the odd-order nonrecursive digital filter df, whose two outputs provide the delayed digital signal x' and the Hilbert-transformed signal y, respectively. The further processing of these two signals is identical with the processing of FIG. 1.

Figure 3:
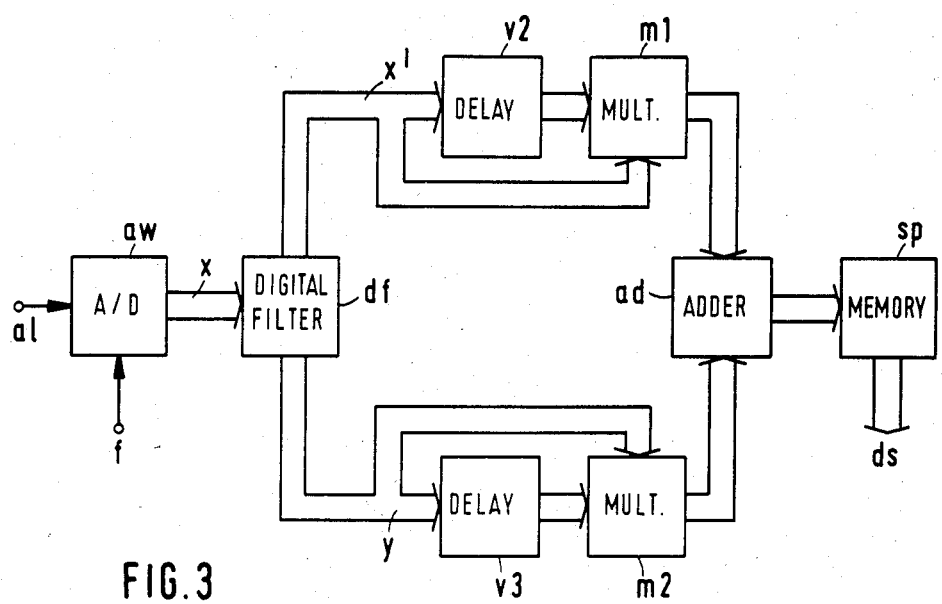
FIG. 3 is a block diagram of an improvement on the arrangement of FIG. 2.

FIG. 3 shows an improvement on the arrangement of FIG. 2 which may also be incorporated in the arrangement of FIG. 1. The improvement consists in the provision of the electronic memory sp, containing the arc-sin function, at the output of the adder ad, so that the demodulated signal ds appears at the output of the memory sp. Such an arc-sin memory is known per se from the last-mentioned Offenlegungsschrift.

Figure 4:
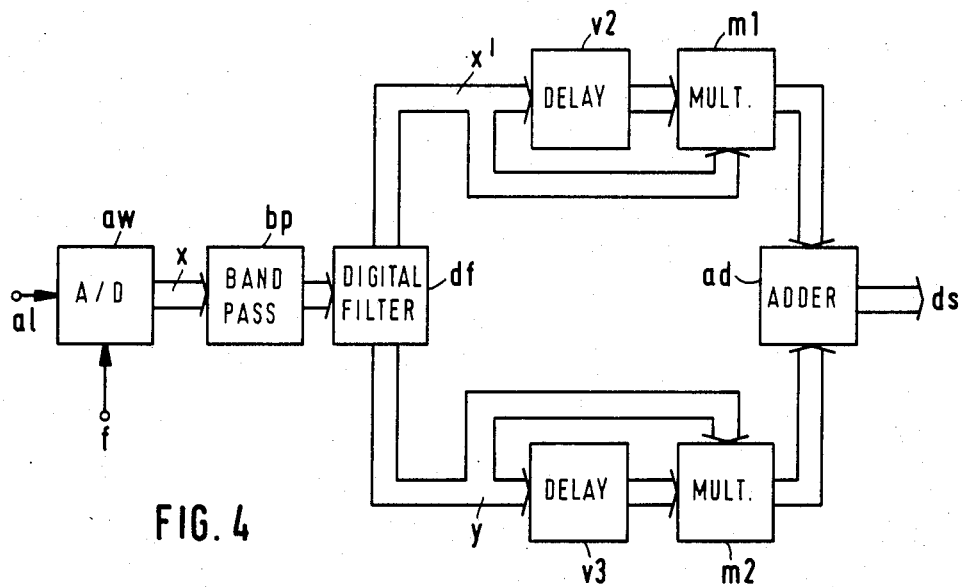
FIG. 4 shows another improvement on the arrangement of FIG. 2.

FIG. 4 shows another improvement on the arrangement of FIG. 2 which can be incorporated both in the arrangement of FIG. 1 and in that of FIG. 3. The digital signal x is subjected to a digital band limitation before being fed to the following subcircuits, i.e., that the digital-to-analog converter is directly followed by the digital band-pass filter bp. This band-pass filter suppresses interference signals lying outside the frequency-modulated intelligence signal. In a preferred embodiment of the invention, this band-pass filter bp contains a clock-frequency-decimating stage. If the clock frequency $f_t$ is decimated by the integral factor N to $f_d = f_t/N$, the passband of the band-pass filter must lie in one of the frequency bands between $nf_d/2$ and $(n+1)f_d/2$, where n is an integer and lies between O and N−1.

The arrangemenyt of FIG. 3 can be implemented without a prohibitive amount of circuitry if the digital signal has about 6 to 8 bits, which is sufficient for the usual processing of video signals. For the processing of audio signals, which requires about 15 bits for the digital signal x, such a memory in integrated form would occupy a chip area which could only be implemented at prohibitive expense with state-of-the-art semiconductor technology. For FM detection of audio signals, therefore, the embodiments of FIGS. 1, 2, and 4 are presently to be preferred.

As is commonly done in analog frequency detection, the analog signal to be demodulated, a1, is limited in amplitude ahead of the analog-to-digital converter aw in order to suppress any amplitude modulation superimposed on the frequency-modulated signal. Should this be impossible or appear inappropriate, the limiting action can also be performed on the digital side, e.g., by means of a digital amplitude limiter at the output of the analog-to-digital converter aw or by means of an amplitude-correcting stage to which the demodulated output signal ds is applied. Automatic gain control on the analog or digital side is also possible.

The invention can be readily implemented with integrated circuits or as one integrated circuit or a part thereof. For such implementation, the preferred embodiment of FIG. 2 is particularly advantageous, because the odd-order nonrecursive digital filter df, which is used in that embodiment and the embodiments of FIGS. 3 and 4, has the following favorable properties. The group delay is an integral multiple of the period of the clock signal f, and the pulse response is antisymmetric; every other value of the pulse response is zero, and the phase difference between an input signal and output signal is exactly 90°. For example, a 15th-order filter of this kind designed for a digital frequency detector for FM video signals and having a bandwidth from 0.08 to 0.42 $f_t$ (at $f_t = 17.8$ MHz, this corresponds to a bandwidth of 1.42 to 7.48 MHz) has an amplitude deviation in the useful band below 1%, and the filter itself requires only 9 additions and four subtractions, so that it occupies a comparatively small area of the semiconductor chip.

What is claimed is:

1. A digital FM detector comprising
   an analog to digital converter for receiving FM analog signals and deriving digital signals therefrom, the output of said analog-to-digital converter being coupled to first terminals;
   a digital 90° phase shifter having inputs coupled to said first terminals;
   a first delay element having an input coupled to said first terminals and providing a delay equal to the delay of said phase shifter;
   a second delay element coupled to the output of said first delay element and providing a predetermined delay;
   a first multiplier having first inputs coupled to the output of said first delay element, second inputs coupled to the output of said second delay element, and having an output;
   a third delay element coupled to the output of said phase shifter and providing said predetermined delay;
   a second multiplier having a first input coupled to the output of said phase shifter, a second input coupled to the output of said third delay element, and having an output; and
   an adder having a first input coupled to said first multiplier output, a second input coupled to said second multiplier output and an output, said adder output being coupled to output terminals.

2. A digital FM detector in accordance with claim 1 comprising:
   a memory having inputs coupled to said adder output and outputs coupled to said output terminals, said memory being interposed between said adder output and said output terminals and containing arc-sin functions and responsive to said adder output for forming a demodulated digital signal at said output terminals.

3. A digital FM detector in accordance with claim 1 comprising:
   a digital band pass filter for passing said digital signals and suppressing interfering components, said digital band pass filter being disposed between said analog to digital converter output and said first terminals.

4. A digital FM detector in accordance with claim 2 comprising:
   a digital band pass filter for passing said digital signals and suppressing interfering components, said digital band pass filter being disposed between said analog to digital converter output and said first terminals.

5. A digital FM detector in accordance with claim 4 wherein:
   said analog to digital converter is clocked by signals at a first clock frequency; and
   said band-pass filter contains a stage for decimating said clock frequency by an integral factor.

6. A digital FM detector comprising
   an analog to digital converter for receiving FM analog signals and deriving digital signals therefrom; the output of said analog-to-digital converter being coupled to first terminals;
   an odd-order nonrecursive digital filter having inputs coupled to said first terminals;
   a first delay element coupled to the output of said digital filter and providing a predetermined delay;
   a first multiplier having first inputs coupled to the output of said digital filter, second inputs coupled to the output of said first delay element, and having an output;
   a second delay element coupled to the output of said digital filter and providing said predetermined delay;

a second multiplier having a first input coupled to the output of said digital filter, a second input coupled to the output of said second delay element, and having an output; and an adder having a first input coupled to said first multiplier output, a second input coupled to said second multiplier output and an output, said adder output being coupled to output terminals.

7. A digital FM detector in accordance with claim 6 comprising:

a memory having inputs coupled to said adder output and outputs coupled to said output terminals, said memory being interposed between said adder output and said output terminals and containing arcsin functions and responsive to said adder output for forming a demodulated digital signal at said output terminals.

8. A digital FM detector in accordance with claim 6 comprising:

a digital band pass filter for passing said digital signals and suppressing interfering components, said digital band pass filter being disposed between said analog to digital converter output and said first terminals.

9. A digital FM detector in accordance with claim 7 comprising:

a digital band pass filter for passing said digital signals and suppressing interfering components, said digital band pass filter being disposed between said analog to digital converter output and said first terminals.

10. A digital FM detector in accordance with claim 9 wherein:

said analog to digital converter is clocked by signals at a first clock frequency; and said band-pass filter contains a stage for decimating said clock frequency by an integral factor.

11. A digital FM detector operating on digital signals representative of analog FM signals, said detector comprising first terminals receiving said digital signals;

a digital 90° phase shifter having inputs coupled to said first terminals;

a first delay element having an input coupled to said first terminals and providing a delay equal to the delay of said phase shifter;

a second delay element coupled to the output of said first delay element and providing a predetermined delay;

a first multiplier having first inputs coupled to the output of said first delay element, second inputs coupled to the output of said second delay element, and having an output;

a third delay element coupled to the output of said phase shifter and providing said predetermined delay;

a second multiplier having a first input coupled to the output of said phase shifter, a second input coupled to the output of said third delay element, and having an output; and an adder having a first input coupled to said first multiplier output, a second input coupled to said second multiplier output and an output, said adder output being coupled to output terminals.

12. A digital FM detector in accordance with claim 11 comprising:

a memory having inputs coupled to said adder output and outputs coupled to said output terminals, said memory being interposed between said adder output and said output terminals and containing arcsin functions and responsive to said adder output for forming a demodulated digital signal at said output terminals.

13. A digital FM detector in accordance with claim 11 comprising:

a digital band pass filter for passing said digital signals and suppressing interfering components, said digital band pass filter being disposed between the source of said digital signals and said first terminals.

14. A digital FM detector in accordance with claim 12 comprising:

a digital band pass filter for passing said digital signals and suppressing interfering components, said digital band pass filter being disposed between the source of said digital signals ans said first terminals.

15. A digital FM detector in accordance with claim 14 wherein:

said analog to digital converter is clocked by signals at a first clock frequency; and said band-pass filter contains a stage for decimating said clock frequency by an integral factor.

16. A digital FM detector operating on digital signals representative of analog FM signals, said detector comprising first terminals receiving said digital signals;

an odd-order nonrecursive digital filter having inputs coupled to said first terminals;

a second delay element coupled to the output of said digital filter and providing a predetermined delay;

a first multiplier having first inputs coupled to the output of said digital filter, second inputs coupled to the output of said second delay element, and having an output;

a third delay element coupled to the output of said digital filter and providing said predetermined delay;

a second multiplier having a first input coupled to the output of said digital filter, a second input coupled to the output of said third delay element, and having an output; and an adder having a first input coupled to said first multiplier output, a second input coupled to said second multiplier output and an output, said adder output being coupled to output terminals.

17. A digital FM detector in accordance with claim 16 comprising:

a memory having inputs coupled to said adder output and outputs coupled to said output terminals, said memory being interposed between said adder output and said output terminals and containing arcsin functions and responsive to said adder output for forming a demodulated digital signal at said output terminals.

18. A digital FM detector in accordance with claim 16 comprising:

a digital band pass filter for passing said digital signals and suppressing interfering components, said digital band pass filter being disposed between said analog to digital converter output and said first terminals.

19. A digital FM detector in accordance with claim 17 comprising:

a digital band pass filter for passing said digital signals and suppressing interfering components, said digital band pass filter being disposed between said analog to digital converter output and said first terminals.

20. A digital FM detector in accordance with claim 19 wherein:

said analog to digital converter is clocked by signals at a first clock frequency; and
said band-pass filter contains a stage for decimating said clock frequency by an integral factor.

* * * * *